United States Patent
Park et al.

(10) Patent No.: US 9,582,053 B2
(45) Date of Patent: Feb. 28, 2017

(54) METHOD AND APPARATUS FOR ERASING MEMORY DATA

(71) Applicant: ELECTRONICS AND TELECOMMUNICATIONS RESEARCH INSTITUTE, Daejeon (KR)

(72) Inventors: Dae Seon Park, Daejeon (KR); Bon Seok Koo, Daejeon (KR); Jung Hyung Park, Daejeon (KR); Jin Ha Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 136 days.

(21) Appl. No.: 14/561,691

(22) Filed: Dec. 5, 2014

(65) Prior Publication Data

US 2015/0338893 A1 Nov. 26, 2015

(30) Foreign Application Priority Data

May 22, 2014 (KR) ........................ 10-2014-0061365

(51) Int. Cl.
*G06F 9/30* (2006.01)
*G06F 12/00* (2006.01)
(Continued)

(52) U.S. Cl.
CPC ............... *G06F 1/24* (2013.01); *G06F 1/3293* (2013.01); *G06F 9/30043* (2013.01);
(Continued)

(58) Field of Classification Search
USPC ........................................................ 711/166
See application file for complete search history.

(56) References Cited

U.S. PATENT DOCUMENTS

| | | | | |
|---|---|---|---|---|
| 5,535,168 A | * | 7/1996 | Yepez, III | G11C 16/22 257/922 |
| 8,874,835 B1 | * | 10/2014 | Davis | G06F 3/0679 711/103 |

(Continued)

FOREIGN PATENT DOCUMENTS

| | | |
|---|---|---|
| JP | 2002-325280 A | 11/2002 |
| JP | 2006-259781 A | 9/2006 |

(Continued)

*Primary Examiner* — Mark Giardino, Jr.
*Assistant Examiner* — Mohamed Gebril
(74) *Attorney, Agent, or Firm* — LRK Patent Law Firm

(57) ABSTRACT

A memory erasing method and apparatus for erasing important data of a nonvolatile memory within the apparatus to prevent illegal access using attitude information measured in an inertial measurement sensor and a low power microprocessor regardless of the power supply state of the apparatus. The apparatus includes a power switching circuit unit for selecting one from among an external power source and a battery. An inertial measurement sensor measures attitude information of the memory erasing apparatus, using power supplied from the external power source or the battery. A low power microprocessor erases important data from a memory device in a first manner using power from the external power source, and in a second manner using power from the battery, the first manner being different from the second manner.

13 Claims, 5 Drawing Sheets

(51) Int. Cl.
*G06F 1/24* (2006.01)
*G06F 1/32* (2006.01)
*G11C 16/14* (2006.01)
*G11C 16/30* (2006.01)
*G11C 5/14* (2006.01)
*G11C 16/22* (2006.01)

(52) U.S. Cl.
CPC .............. *G11C 5/141* (2013.01); *G11C 16/14* (2013.01); *G11C 16/22* (2013.01); *G11C 16/30* (2013.01)

(56) References Cited

U.S. PATENT DOCUMENTS

| | | | |
|---|---|---|---|
| 2010/0031368 A1* | 2/2010 | Park | G06F 21/554 726/26 |
| 2012/0203488 A1* | 8/2012 | Dusha | G01C 21/16 702/104 |
| 2013/0283386 A1 | 10/2013 | Lee | |

FOREIGN PATENT DOCUMENTS

| | | |
|---|---|---|
| JP | 2006-277400 A | 10/2006 |
| JP | 2008-176390 A | 7/2008 |
| KR | 10-2013-0126804 A | 11/2013 |

\* cited by examiner

METHOD AND APPARATUS FOR ERASING MEMORY DATA

CROSS REFERENCE TO RELATED APPLICATION

This application claims the benefit of Korean Patent Application No. 10-2014-0061365, filed May 22, 2014, which is hereby incorporated by reference in its entirety into this application.

BACKGROUND OF THE INVENTION

1. Technical Field

The present invention relates generally to a method and apparatus for erasing memory data and, more particularly, to a method and apparatus for erasing important information from nonvolatile memory using an inertial measurement sensor and a low power microprocessor, regardless of the state of a power supply, when the embedded device is overturned.

2. Description of the Related Art

There are approaches to protect important data in a device from physical illegal tampering, such as opening, damage or cutting, when such activities are detected, as exemplified by incapacitating the memory device to be protected or erasing important information from the memory device.

Once a memory device storing important data to be protected is incapacitated, significant costs are required for reusing the memory device. Considering this, hence, an approach of erasing important data from the memory device itself may guarantee more effective security and safety.

FIG. 1 is a schematic view of the organization of a conventional device for erasing data from a memory device to protect against illegal tampering.

With reference to FIG. 1, the conventional device includes a cover 1 for protecting the device of interest, an illegal tampering detector 2 for detecting electric separation, a surface mounted device 3 to be protected, a circuit board 4 on which the device 3 is surface mounted, a connector 5, a controller 6 for erasing or incapacitating data, and a power supplier 7 for supplying electric power.

In FIG. 1, the device 3 is a memory apparatus in which data concerning security or authentication has been stored.

External impact, such as that attributed to the separation of the circuit board 4 from the cover 1 or the drilling of a hole through the cover 1, causes the connector 5 to separate from the contact, resulting in an electrical change which is readily detected by the illegal tampering detector 2. As soon as an illegal tampering signal from the illegal tampering detector 2 is received, the controller 6 erases or incapacitates data stored in the device 3 which must be protected from illegal tampering.

In addition, the cover 1 and circuit board 4 are combined with screws or other locking measures, and they can be separated for the purpose of repair by loosening the screws or releasing a locking mechanism.

The conventional memory erasing device shown in FIG. 1 is designed to operate a memory erasing function only in the case of a direct physical attack on the device. This design has the disadvantage of being unable to erase the memory at a phase before a physical attack. Another disadvantage is found in that the memory erasing function might not operate when abnormal manipulations other than illegal tampering such as opening, cutting or damaging the memory device occur.

Therefore, there is an urgent need for an approach for the safe and effective erasure of important data from a memory device to be protected at a stage before a physical attack (opening/cutting/damaging) on the memory device is made.

A prior art is disclosed in Korean Patent Application Publication No. 10-2013-0126804 which discloses a cover responsive to illegal tempering and abnormal manipulations to protect data in a protected device.

SUMMARY OF THE INVENTION

Accordingly, the present invention has been made in order to resolve the above problems occurring in the conventional art, and an object of the present invention is to provide a method and an apparatus for erasing memory data, characterized by using attitude information detected by an inertial measurement sensor, and a low power process in erasing important data in a nonvolatile memory area within a device so as to prevent illegal access, whether the device is provided with power or not.

In accordance with an aspect of the present invention to accomplish the object, there is provided a method for erasing memory data, including determining, by a low power microprocessor, which of external power and battery power is supplied for measuring attitude information from an inertial measurement sensor; erasing, by the low power microprocessor, important data from a memory device in a first manner if external power is determined to be supplied; and erasing, by the low power microprocessor important data from the memory device in a second manner if battery power is determined to be supplied, the first manner being different from the second manner.

Erasing the important data from the memory device in the first manner may include comparing attitude information with a predetermined threshold value under supply of the external power, with the attitude information being continuously received from the inertial measurement sensor; and blocking power from being supplied to the memory device to erase important data from the memory device if results of the comparison are consistent with a predetermined determination condition for erasing memory data. The predetermined determination condition for erasing memory data may include increasing an error count if the attitude information from the inertial measurement sensor exceeds the predetermined threshold value; and erasing important data from the memory device if the error count exceeds a predetermined maximum value. The predetermined threshold value and the predetermined maximum value may be variable.

Erasing the important data from the memory device in the second manner may include checking, by the low power microprocessor, attitude information from the inertial measurement sensor using the battery power whenever a timer event occurs while the low power microprocessor is operating in a standby state; comparing the attitude information from the inertial measurement sensor with a predetermined threshold value; and blocking power from being supplied to the memory device to erase important data from the memory device if results of the comparison are consistent with a predetermined determination condition for erasing memory data. The predetermined determination condition for erasing memory data may include increasing an error count if the attitude information from the inertial measurement sensor exceeds the predetermined threshold value; and erasing important data from the memory device if the error count exceeds a predetermined maximum value. The predetermined threshold value and the predetermined maximum value may be variable.

The method may further include reading, by the low power microprocessor, a displayed value of a timer to store, within the low power microprocessor, information on time at which a memory erase operation occurs, after the erasing the important data from the memory device in the first or the second manner.

In accordance with another aspect of the present invention to accomplish the object, there is provided a memory erasing apparatus, including a power switching circuit unit for selecting one from among an external power source and a battery; an inertial measurement sensor for measuring attitude information of the memory erasing apparatus, using power supplied from the external power source or the battery; and a low power microprocessor for erasing important data from a memory device in a first manner using power from the external power source, and in a second manner using power from the battery, the first manner being different from the second manner.

The first manner may be carried out by allowing the low power microprocessor to determine, using power from the external power source, whether attitude information being continuously received from the inertial measurement sensor exceeds a predetermined threshold value; increasing an error count if the attitude information exceeds the predetermined threshold value; and erasing important data from the memory device if the error count exceeds a predetermined maximum value. The predetermined threshold value and the predetermined maximum value may be variable.

The memory erasing apparatus may further include a timer for displaying a time at which the memory erase operation by the low power microprocessor occurs.

The second manner may be carried out by allowing the low power microprocessor to determine, using power from the battery, whether attitude information from the inertial measurement sensor exceeds a predetermined threshold value, as the low power microprocessor in a standby state undergoes a timer event; increasing an error count if the attitude information exceeds the predetermined threshold value; and erasing important data from the memory device if the error count exceeds a predetermined maximum value. The predetermined threshold value and the predetermined maximum value may be variable.

The low power microprocessor may read a displayed value of the timer to store, within the low power microprocessor, information on time at which a memory erase operation occurs, after erasing important data from the memory device.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
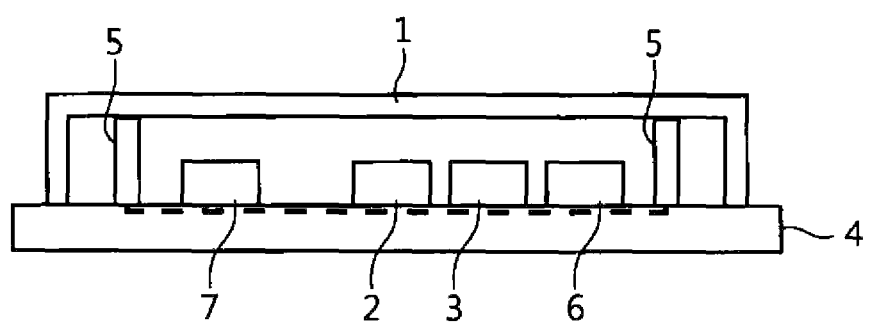
FIG. 1 is a schematic view of the organization of a conventional apparatus for erasing data from a memory device to protect against illegal tampering.

The present invention aims to protect a device against illegal access thereto by measuring attitude information of the device with an inertial measurement sensor, and erasing important data from nonvolatile memory when the measurement exceeds a predetermined threshold value.

On the other hand, the present invention is intended to enable the inertial measurement sensor to always measure attitude information using a low power microprocessor regardless of power supply conditions to the device.

In addition, the present invention provides a method of adjusting the threshold value to erase important data from the memory device using the attitude information of the inertial measurement sensor, and a method of recording and reading times at which a memory erase operation has occurred.

The present invention may be variously changed and may have various embodiments, and specific embodiments will be described in detail below with reference to the attached drawings.

However, it should be understood that those embodiments are not intended to limit the present invention to specific disclosure forms and they include all changes, equivalents or modifications included in the spirit and scope of the present invention.

The terms used in the present specification are merely used to describe specific embodiments and are not intended to limit the present invention. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains. The terms identical to those defined in generally used dictionaries should be interpreted as having meanings identical to contextual meanings of the related art, and are not interpreted as being ideal or excessively formal meanings unless they are definitely defined in the present specification.

Embodiments of the present invention will be described in detail with reference to the accompanying drawings. In the following description of the present invention, the same reference numerals are used to designate the same or similar elements throughout the drawings and repeated descriptions of the same components will be omitted.

Figure 2:
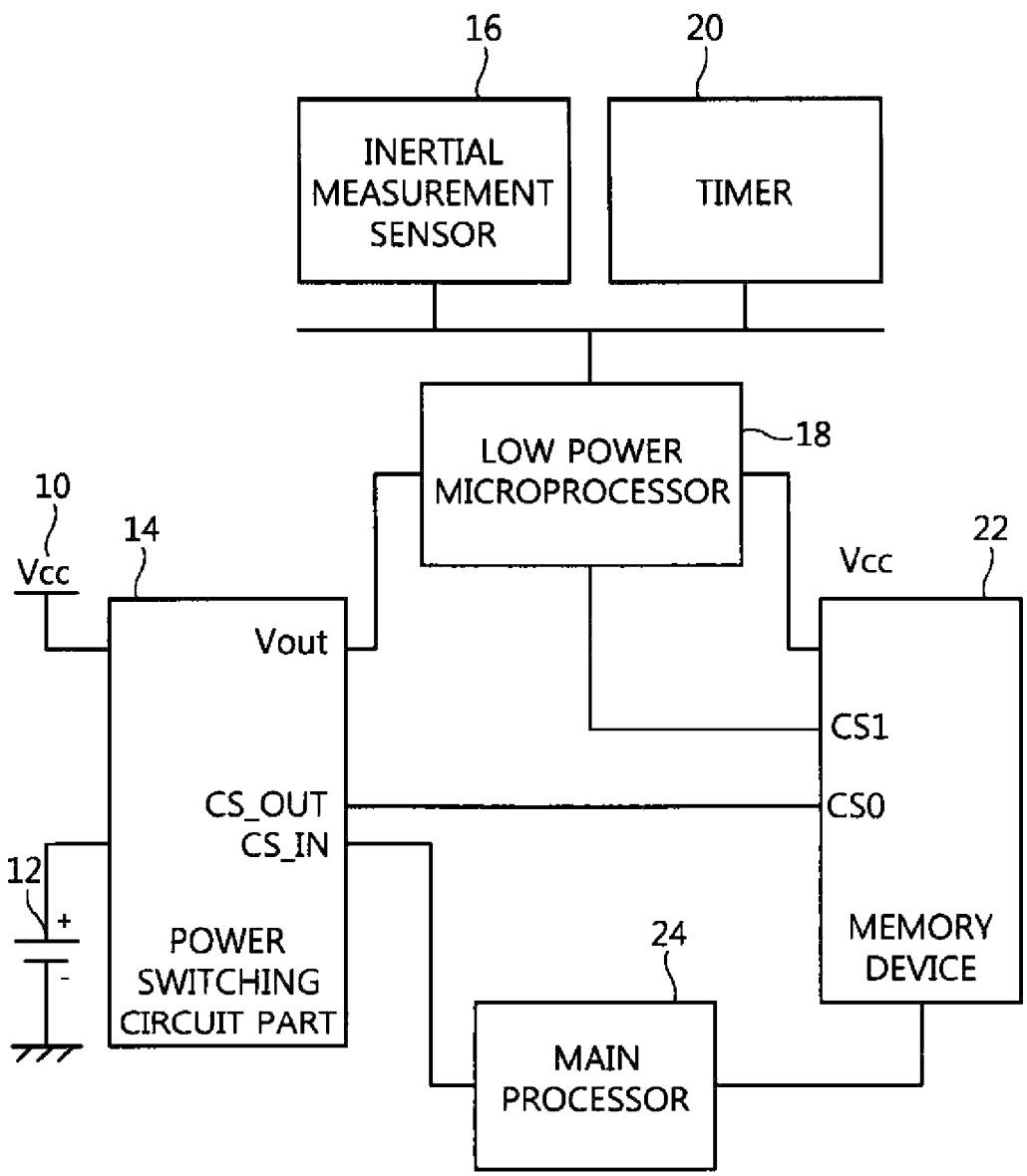
FIG. 2. is a block diagram of a system applied with a memory erasing apparatus according to an embodiment of the present invention.

FIG. 2 is a block diagram of a system applied with a memory erasing apparatus according to an embodiment of the present invention.

The system applied with a memory erasing apparatus according to an embodiment of the present invention includes an external power source 10, a battery 12, a power switching circuit unit 14, an inertial measurement sensor 16, a low power microprocessor 18, a timer 20, a memory device 22, and a main processor 24.

In accordance with an embodiment of the present invention, if the size of important data to be protected is approximately 2 Kbytes or less, it is not stored in the memory device 22, but it may be stored in a separate memory (not shown) within the low power microprocessor 18. In this case, the memory erasing apparatus according to the present invention may ensure improved stability and security. In the specification, it is understood that the memory erasing apparatus includes the power switching circuit part 14, the inertial measurement sensor 16, the low power microprocessor 18 and the timer 20.

The external power source 10 supplies power (i.e. external power) to the memory erasing apparatus in which the low power microprocessor 18 and the inertial measurement sensor 16 are set.

The battery 12 supplies power when the external power source 10 does not work. In other words, the battery 12 supplies power (i.e. battery power) to the memory erasing apparatus comprising the low power microprocessor 18 and the inertial measurement sensor 16 when external power source 10 does not supply power to the system.

The power switching circuit unit 14 functions to switch the power supply between the external power source 10 and the battery 12 on the basis of a difference in voltages supplied from the external power source 10 and the battery 12. In other words, the power switching circuit unit 14 determines the voltage difference between the external power source 10 and the battery 12, and selects power to be used by the memory erasing apparatus. For example, in order to enable the memory erasing apparatus according to an embodiment of the present invention to operate whether the external power source 10 supplies power to the apparatus or not, the power switching circuit unit 14 allows for the use of the battery 12 when it works alone, but functions to select the power from the external power source 10 when both the external power source 10 and the battery are available.

The inertial measurement sensor 16 is a sensor which is designed to change the variation of gravitational accelerations into voltage variation and to measure attitude information using the voltage variation.

In other words, the inertial measurement sensor 16 may measure attitude information of the apparatus (i.e. memory erasing apparatus) using power from the external power source 10. On the other hand, the inertial measurement sensor 16 may measure attitude information of the apparatus (i.e. memory erasing apparatus) using power supplied from the battery 12.

In this case, the attitude information measured by the inertial measurement sensor 16 may be applied to two manners for erasing important data from the memory device 22. In a first manner, the low power microprocessor 18 may determine, using power supplied from the external power source 10, whether constant attitude information from the inertial measurement sensor 16 exceeds a predetermined attitude information threshold value and may erase important data from the memory device 22 depending on the results. In a second manner, the low power microprocessor 18 may determine, using power supplied from the battery 12, whether any timer event has occurred and whether attitude information from the inertial measurement sensor 16 exceeds the predetermined attitude information threshold value, and may erase important data from the memory device 22 depending on the results.

After all, the attitude information measured in the inertial measurement sensor 16 is used to determine whether it exceeds the predetermined attitude information threshold value described in the first and second manners.

The timer 20 is to record a time at which a memory erase operation by the low power microprocessor 18 occurs. That is, the timer 20 provides the low power microprocessor 18 with time information in month/day/year/hour/minute/second units upon operation of the erasing function when any important information within the memory device 22 has been erased by the low power microprocessor 18. For example, the timer 20 includes an RTC (Real Time Clock) chip.

The memory device 22 stores important data required for the main processor 24 for data encryption and authentication.

The main processor 24 is able to operate only when power is supplied from the external power source 10, and to execute algorithms for encryption and authentication using important data stored in the memory device 22.

The low power microprocessor 18 compares attitude information measured by the inertial measurement sensor 16 with the predetermined threshold value, increases a count value depending on the comparison result, determines memory erasing conditions and erases the memory depending on the determination result.

The low power microprocessor 18 measures attitude information of the apparatus using the inertial measurement sensor 16, determines whether the measured attitude information exceeds the threshold value, and constantly increases the error count value if any abnormal attitude is maintained. If the error count value exceeds the predetermined maximum value in the low power microprocessor 18, the low power microprocessor 18 erases all important data from the memory device 22, reads a displayed value of the timer 20 and records time information when a memory erase operation has occurred.

As mentioned above, according to an embodiment of the present invention, the memory erasing apparatus is able to execute functions such as measurement of attitude information, comparison of threshold value and count value, memory erasing, storage of memory erasing time, etc., regardless of the status of power supply. In other words, the memory erasing apparatus according to the present invention is able to operate whether power is supplied from the external power source 10 or not.

In the absence of the power from the external power source 10, the low power microprocessor 18 is switched from a low power mode to an active mode using battery power upon a timer event. In this state, the low power microprocessor 18 records and manages the attitude information measured in the inertial measurement sensor 16. At this time, when checking the recorded and managed attitude information, if any abnormal attitude is maintained for a predetermined time, the low power microprocessor 18 disconnects the power supplied to the nonvolatile memory. Therefore, important information of the nonvolatile memory is safely erased.

On the other hand, when power is supplied from the external power source 10, the low power microprocessor 18 with external power source 10 is able to constantly detect attitude using the inertial measurement sensor 16. After checking attitude information of the inertial measurement sensor 16, if the attitude information exceeds the predetermined attitude information threshold value, which results in the error count exceeding the predetermined maximum value, and if it is determined that the memory is required to be erased, the low power microprocessor 18 is able to safely erase important information of the nonvolatile memory in the same way of operation as the low power state.

In other words, the low power microprocessor 18 operates in a low power mode, when external power source 10 is not supplied. When a timer event has occurred, the low power microprocessor 18 changes its operation mode from a low power mode to an active mode. At this moment, the low power microprocessor 18 using a power of the battery 12 inputs a voltage value of the acceleration of gravity measured by inertial measurement sensor 16 into an analog-digital converter (not shown) and converts it into an arbitrary value. The low power microprocessor 18 compares the converted attitude information with the predetermined threshold value, and increases the value of threshold value exceeding count if it determines that the converted attitude information exceeds the threshold value. In addition, if the value of threshold value exceeding count exceeds the maximum value, the low power microprocessor 18 disconnects the power supplied to the memory device 22 to erase important data stored in it. After erasing the important data the low power microprocessor 18 reads displayed value of the timer 20 and stores time information when memory erase operation has occurred into a separate memory space of the low power microprocessor 18.

On the contrary, when the external power source 10 is supplied, the low power microprocessor 18 is able to carry out constant attitude information measurement and threshold value monitoring using the external power source 10.

As mentioned above, the low power microprocessor 18 is able to measure attitude information of the device in a first manner using the external power source 10, compare the threshold value, and erase important information of the memory. On the other hand, the low power microprocessor 18 is able to erase important information of the memory in a second manner, using a power supplied from the battery 12. At the moment, the first and the second manners have been already described upon describing the inertial measurement sensor 16.

Figure 3:
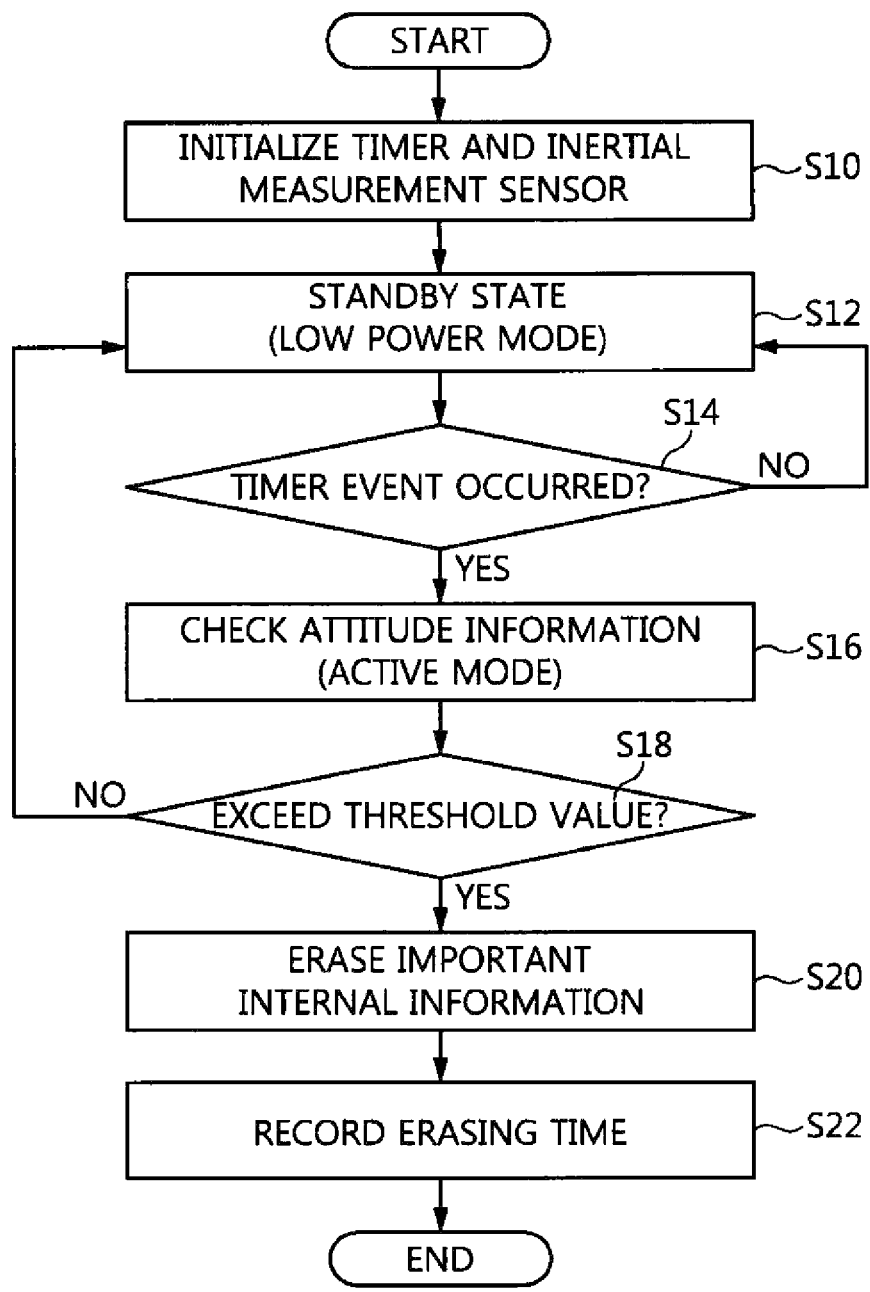
FIG. 3 is a flowchart illustrating processes of measuring attitude information and erasing memory data if the measurement exceeds a threshold value, with the use of battery power in the absence of power from an external power source, in accordance with an embodiment of the present invention.

FIG. 3 is a flowchart to describe operations to measure attitude information and erase a memory upon exceeding a threshold value using battery power without any external power supplied according to an embodiment of the present invention. That is, with reference to FIG. 3, it is possible to understand operations to measure attitude information and erase memory using power supplied from the battery 12.

At first, at step S10, the initialization of system resources and other major devices required to use the memory erasing apparatus is carried out. In this case, the initialization may be assumed by the low power microprocessor 18.

At step S12, low power microprocessor 18 operates in a low power mode, in a standby state before executing an operation.

At step S14, the low power microprocessor 18 operating in a standby state determines whether any timer event has occurred. At this moment, if no timer event has occurred, the low power microprocessor 18 is maintained in the standby state, whereas if any timer event has occurred, the low power microprocessor 18 performs step S16.

At step 516, as a timer event has occurred, the low power microprocessor 18 determines to carry out a memory erase operation in the second manner. Accordingly, the low power microprocessor 18 switches from a low power mode to an active mode using the battery power, and checks attitude information measured by the inertial measurement sensor 16.

At step S18, the low power microprocessor 18 determines whether the measured attitude information exceeds the predetermined threshold value. As a result of determination at step S18, if it is determined that the measured attitude information exceeds the predetermined threshold value, the low power microprocessor 18 increases the error count.

As mentioned above, if the error count exceeds the maximum value, at step S20, the low power microprocessor 18 disconnects the power supplied to the memory device 22 to erase important data from the memory. At the moment, it is understood that the predetermined conditions to determine memory erasing by the low power microprocessor 18 when using a power supply of the battery 12 are described as follows: if the attitude information from the inertial measurement sensor 16 exceeds the predetermined threshold value, the low power microprocessor 18 increases the error count (i.e. threshold value exceeding count) value, and if the error count value exceeds the predetermined maximum value, it erases important data from the memory device 22.

Then, at step S22, the low power microprocessor 18 checks the displayed value of the timer 20 and stores time information when a memory erase operation has occurred into a separate memory (not shown) of the low power microprocessor 18.

At the moment, the second manner is different from the first manner.

In this case, the described steps S16~S22 may operate using a power provided by the battery 12.

Figure 4:
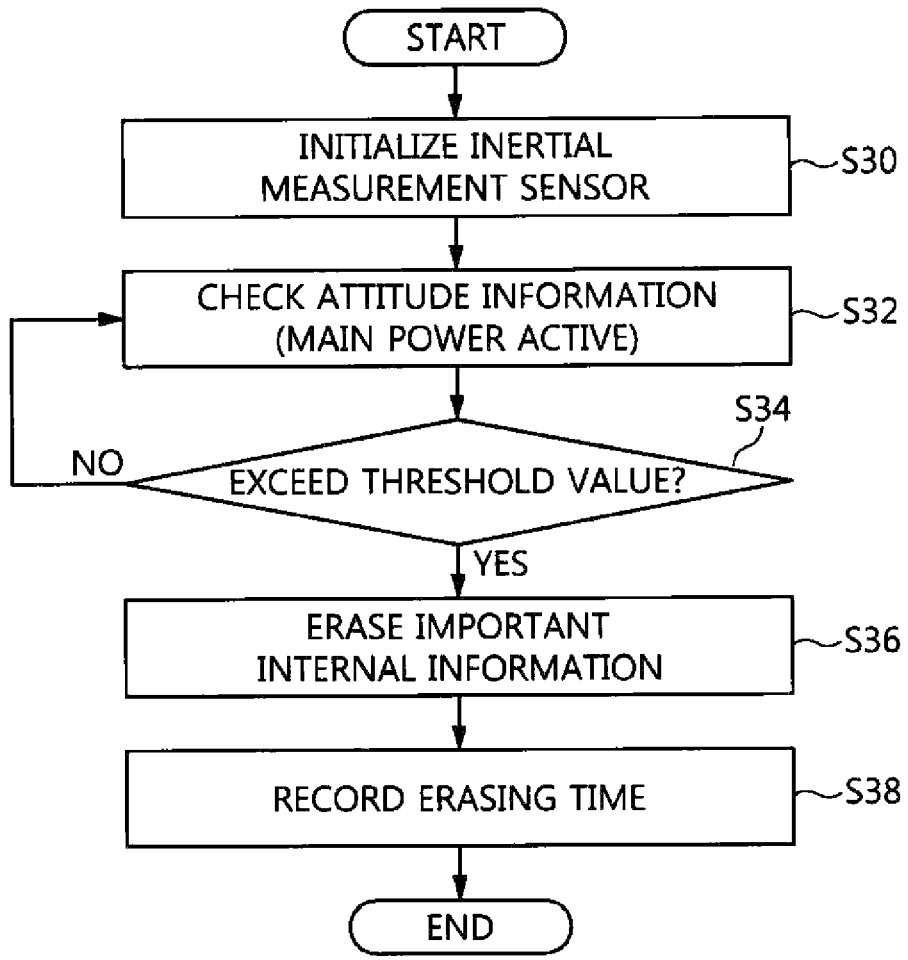
FIG. 4 is a flowchart illustrating the processes of measuring attitude information and erasing memory data if the measurement exceeds a threshold value, with the use of power supplied from an external power source in accordance with an embodiment of the present invention.

FIG. 4 is a flowchart to describe operations to measure attitude information and erase memory data upon exceeding a threshold value using external power according to an embodiment of the present invention. That is, with reference to FIG. 4, it is possible to understand operations to measure attitude information and erase memory data using external power source 10 (main power).

At first, at step S30, it is possible to carry out initialization of an inertial measurement sensor 16 required for the memory erasing apparatus to measure attitude information. In this case, the initialization may be assumed by the low power microprocessor 18.

Afterwards, at step S32, the low power microprocessor 18 is able to constantly check attitude information of the apparatus (i.e. memory erasing apparatus) independent of operation of the main processor 24. In other words, as it is possible to constantly measure attitude information of the apparatus (i.e. memory erasing apparatus) after initialization of the inertial measurement sensor 16, the low power microprocessor 18 is able to constantly check the attitude information.

Afterwards, at step S34, the low power microprocessor 18 determines whether the measured attitude information exceeds the predetermined threshold value. As a result of determination, if it is determined that the measured attitude information exceeds the predetermined threshold value, the low power microprocessor 18 increases the error count.

Then, if the error count exceeds the predetermined maximum value (i.e. threshold value), at step S20, the low power microprocessor 18 disconnects the power supplied to the memory device 22 to erase important data from the memory. At the moment, it is understood that the predetermined conditions to determine memory erasing by the low power microprocessor 18 when using external power source 10 are described as follows: if the attitude information from the inertial measurement sensor 16 exceeds the predetermined threshold value, the low power microprocessor 18 increases the error count value, and if the error count value exceeds the predetermined maximum value, it erases important data from the memory device 22.

Afterwards, at step S38, the low power microprocessor 18 checks the displayed value of the timer 20 and stores time information when a memory erase operation has occurred into a separate memory (not shown) of the low power microprocessor 18.

In this case, the described steps S30~S38 may operate using a power provided by the external power source 10.

Then, the predetermined threshold value and the predetermined maximum value in the first and second manners may be changed according to the ambient environments where the apparatus of the present invention will be installed.

Figure 5:
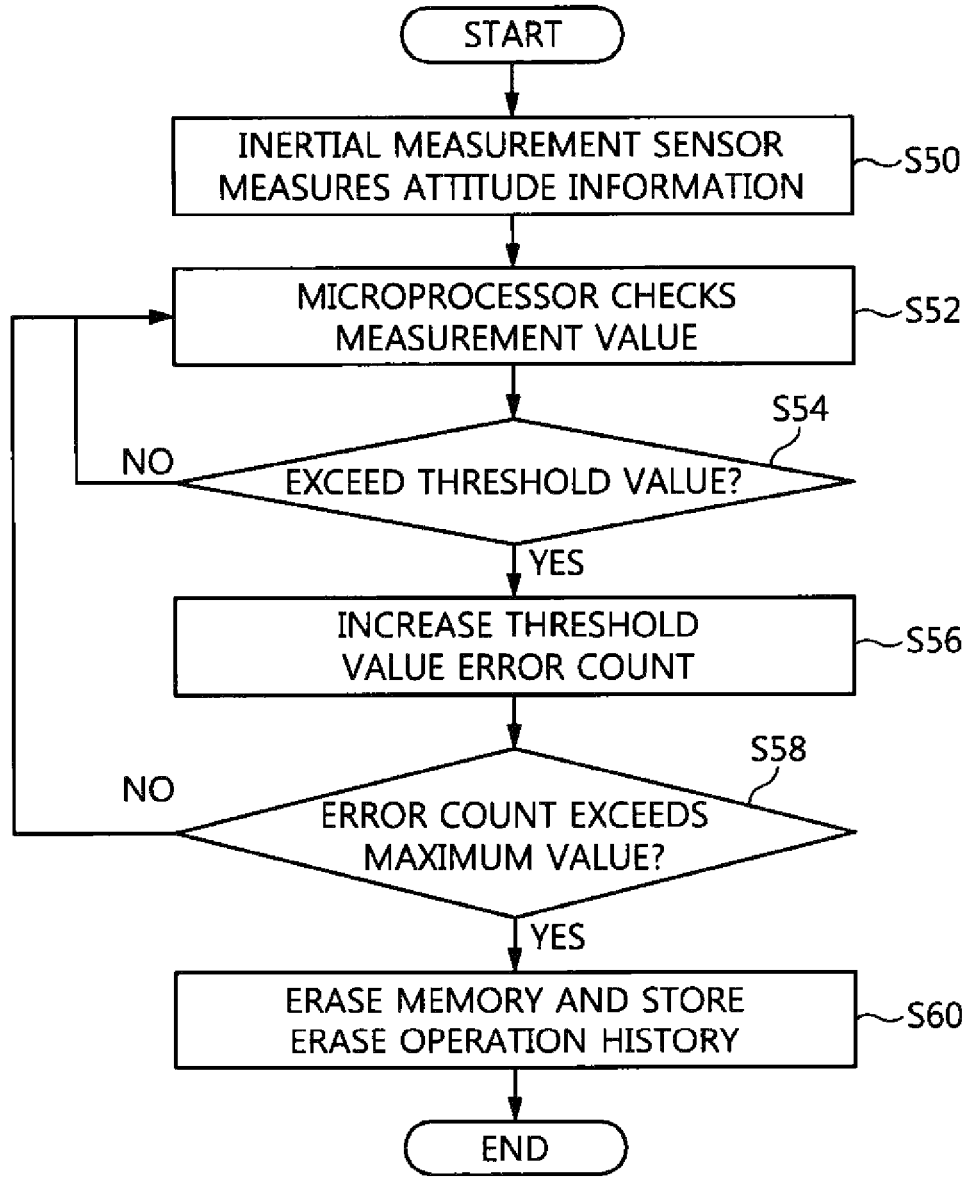
FIG. 5 is a flowchart illustrating processes of measuring attitude information using an inertial measurement sensor, and erasing memory data if both the threshold and the count value satisfy memory erasing conditions according to an embodiment of the present invention.

FIG. 5 is a flowchart to describe operations to measure attitude information using an inertial measurement sensor and erase memory data if both threshold value and count value satisfy memory erasing conditions according to an embodiment of the present invention. That is, with reference to FIG. 5, it is possible to understand processes to determine attitude information measurement and memory erasing conditions using the inertial measurement sensor 16.

While a power from the external power source 10 or the battery 12 is being applied, at step S50, the inertial measurement sensor 16 is able to measure the acceleration of gravity applied to the apparatus (i.e. memory erasing apparatus) and output it as voltage variation.

At step S52, the low power microprocessor 18 is able to convert the voltage value output from the inertial measurement sensor 16 into an arbitrary value using an analog-digital converter.

Afterwards, at step S54 the low power microprocessor 18 determines whether the measured attitude information exceeds the predetermined threshold value.

If it is determined that the measured attitude information exceeds the predetermined threshold value, the low power microprocessor 18 increases the error count at step S56. On the contrary, if the measured attitude information does not exceed the predetermined threshold value, the low power microprocessor 18 is able to return to a step to measure attitude information of the apparatus (i.e. step S50).

Because of the increase of the threshold value error count at step S56, the low power microprocessor 18 determines at step S58 whether the threshold value error count exceeds the predetermined maximum value.

As a result of determination at step S58, if the threshold value error count exceeds the predetermined maximum value, the low power microprocessor 18 at step S60 is able to disconnect power supplied to the memory device 22 to erase important data from the memory. In addition, the low power microprocessor 18 is able to check the displayed value of the timer 20 and store time information in month/day/year/hour/minute/second units upon memory erase operation into a separate memory (not shown) within the low power microprocessor 18.

At this moment, at the above-described steps S50~S60, both the first and second manners may be performed equivalently.

In accordance with the present invention with these configurations, the low power microprocessor may transit from a low power mode to an active mode using battery power via a timer event, and in this state, erase important data from a memory device to intercept illegal access to the data to be protected if orientation information measured from an inertial measurement sensor exceeds a threshold value.

In addition, the present invention allows for the measurement of orientation information both cases of an external power and a battery power supplied so that illegal access can be always detected.

If the memory erasing method using the low power microprocessor proposed in the present invention is applied, it is possible to establish a threshold value to erase data from a memory device and provide a function to check and record time information when an erasing operation has occurred.

As mentioned above, the preferred embodiments of the present invention have been disclosed on the drawings and specifications. Although there are specific terms used, these are for the purpose of illustrating the present invention but limiting meanings or restricting the scope of the present invention described on the scope of claims. Thus, those skilled in the art will appreciate that various modifications, additions and substitutions are possible. Therefore, the true scope of technical protection of the present invention shall be defined by the technical spirit disclosed, in the accompanying claims.

What is claimed is:

1. A method for erasing memory data, comprising:
   determining, by a low power microprocessor, which of external power and
   battery power is supplied for measuring attitude information from an inertial measurement sensor;
   erasing, by the low power microprocessor, important data from a memory device in a first manner if the external power is determined to be supplied; and
   erasing, by the low power microprocessor, the important data from the memory device in a second manner if the battery power is determined to be supplied, the first manner being different from the second manner,
   wherein erasing the important data from the memory device in the second manner comprises:
   checking, by the low power microprocessor, the attitude information from the inertial measurement sensor using the battery power whenever a timer event occurs while the low power microprocessor is operating in a standby state;
   comparing the attitude information from the inertial measurement sensor with a predetermined threshold value; and
   blocking the battery power from being supplied to the memory device to erase the important data from the memory device if results of the comparison are consistent with a predetermined determination condition for erasing memory data.

2. The method of claim 1, wherein erasing the important data from the memory device in the first manner comprises:
   comparing the attitude information with a predetermined threshold value under supply of the external power, with the attitude information being continuously received from the inertial measurement sensor; and
   blocking the external power from being supplied to the memory device to erase the important data from the memory device if results of the comparison are consistent with a predetermined determination condition for erasing memory data.

3. The method of claim 2, wherein the predetermined determination condition for erasing memory data comprises:
   increasing an error count if the attitude information from the inertial measurement sensor exceeds the predetermined threshold value; and erasing the first important data from the memory device if the error count exceeds a predetermined maximum value.

4. The method of claim 3, wherein the predetermined threshold value and the predetermined maximum value are variable.

5. The method of claim 1, wherein the predetermined determination condition for erasing memory data comprises:
increasing an error count if the attitude information from the inertial measurement sensor exceeds the predetermined threshold value; and
erasing the important data from the memory device if the error count exceeds a predetermined maximum value.

6. The method of claim 5, wherein the predetermined threshold value and the predetermined maximum value are variable.

7. The method of claim 1, further comprising reading, by the low power microprocessor, a displayed value of a timer to store, within the low power microprocessor, information on time at which a memory erase operation occurs, after the erasing the important data from the memory device in the first or the second manner.

8. A memory erasing apparatus, comprising:
a power switching circuit unit for selecting one from among an external power source and a battery;
an inertial measurement sensor for of the memory erasing apparatus, using power supplied from the external power source or the battery; and
a low power microprocessor for erasing important data from a memory device in a first manner using power from the external power source, and in a second manner using power from the battery, the first manner being different from the second manner,
wherein the second manner is carried out by:
allowing the low power microprocessor to determine, using power from the battery, whether the attitude information from the inertial measurement sensor exceeds a predetermined threshold value, as the low power microprocessor in a standby state undergoes a timer event;
increasing an error count if the attitude information exceeds the predetermined threshold value; and
erasing important data from the memory device if the error count exceeds a predetermined maximum value.

9. The memory erasing apparatus of claim 8, wherein the first manner is carried out by:
allowing the low power microprocessor to determine, using power from the external power source, whether the attitude information being continuously received from the inertial measurement sensor exceeds a predetermined threshold value;
increasing an error count if the attitude information exceeds the predetermined threshold value; and
erasing important data from the memory device if the error count exceeds a predetermined maximum value.

10. The memory erasing apparatus of claim 9, wherein the predetermined threshold value and the predetermined maximum value are variable.

11. The memory erasing apparatus of claim 8, further comprising a timer for displaying a time at which the memory erase operation by the low power microprocessor occurs.

12. The memory erasing apparatus of claim 8, wherein the predetermined threshold value and the predetermined maximum value are variable.

13. The memory erasing apparatus of claim 11, wherein the low power microprocessor reads a displayed value of the timer to store, within the low power microprocessor, information on time at which a memory erase operation occurs, after erasing important data from the memory device.

* * * * *